United States Patent [19]
Huang et al.

[11] Patent Number: 6,083,775
[45] Date of Patent: Jul. 4, 2000

[54] METHOD OF ENCAPSULATING A CHIP

[75] Inventors: Chien Ping Huang, Hsinchu Hsien; Yang Chun Huang, Changhua Hsien; Kevin Yu, Changhua Hsien; Sheng-Fang Chen, Changhua Hsien, all of Taiwan

[73] Assignee: Siliconware Precision Industries Co., Ltd., Taichung, Taiwan

[21] Appl. No.: 09/245,439

[22] Filed: Feb. 5, 1999

[30] Foreign Application Priority Data

Feb. 7, 1998 [TW] Taiwan .................. 87101644

[51] Int. Cl.[7] .................. H01L 21/44; H01L 21/48; H01L 21/50
[52] U.S. Cl. .................. 438/118; 438/127
[58] Field of Search .................. 438/118, 127

[56] References Cited

U.S. PATENT DOCUMENTS

| | | | |
|---|---|---|---|
| 5,542,171 | 8/1996 | Juskey et al. | 29/840 |
| 5,635,671 | 6/1997 | Freyman | 174/52.2 |
| 5,852,870 | 12/1998 | Freyman | 29/841 |
| 5,961,912 | 10/1999 | Huang | 264/272.15 |
| 5,981,873 | 11/1999 | Heo | 174/52.2 |

*Primary Examiner*—Charles Bowers
*Assistant Examiner*—Nema Berezny
*Attorney, Agent, or Firm*—Mikio Ishimaru

[57] ABSTRACT

A method of making a semiconductor package comprises applying a coating layer to a degating region of a substrate on which a runner and a gate of an encapsulating mold are located, allowing the adhesion between the coating layer and the surface of the substrate to be less than that between the coating layer and a molding compound subsequently molded over the coating layer. A semiconductor chip is then attached to the substrate followed by a cleaning treatment to the surfaces of the substrate and semiconductor chip. The semiconductor chip is then electrically connected to the substrate by wire bonding. After that, the molding compound is transfer molded to enclose the semiconductor chip and part of the surface of the substrate. The molding compound solidified and formed in the runner and gate of the encapsulating mold is then removed from the substrate by breaking away, together with the coating layer adhered thereto.

8 Claims, 6 Drawing Sheets

FIG. 6

601 APPLY A COATING AT THE DEGATING REGION WHICH IS PRESENT ON A SUBSTRATE.

602 ATTACH A SEMICONDUCTOR CHIP TO THE SUBSTRATE.

603 CLEAN OUT IMPURITIES ON THE SURFACE OF THE CHIP AND THE SUBSTRATE.

604 WIRE BOND THE CHIP AND THE SUBSTRATE WITH GOLD WIRE.

605 USE A MOLDING COMPOUND TO ENCLOSE THE CHIP AND THE SUBSTRATE.

606 REMOVE THE MOLDING COMPOUND IN THE RUNNER AND GATE FROM THE SUBSTRATE.

METHOD OF ENCAPSULATING A CHIP

FIELD OF THE INVENTION

This invention relates to a method of making a semiconductor package, and more particularly, to a method of making a semiconductor package, in which an encapsulant is formed by a molding compound encapsulating a semiconductor chip attached to a substrate.

BACKGROUND OF THE INVENTION

Generally, in the industry a two-piece mold, upper mold and lower mold, is used in a transfer molding process for encapsulating a semiconductor chip and a substrate to which the semiconductor chip is attached with a molding compound. The reason why a two-piece mold is currently widely employed by the industry is that drawbacks such as low productivity, increase in complexity of molding and high cost of manufacture still exist in a three-piece or a modified two-piece mold, making them unsuitable for mass production. However, in a conventional two-piece mold composed of an upper mold and a lower mold, each having a mold cavity, a gate should be provided for molten molding compound to flow from a runner connected to a central reservoir storing the molten molding compound, into the mold cavities where the molten molding compound is solidified and formed into an encapsulant enclosing the semiconductor chip and substrate. The gate is provided for control of the flow and injection velocity of the molten molding compound from the runner into the mold cavity. When the encapsulant is solidified in the mold cavities, excess molding compound in the runner and the gate is also solidified on areas of the substrate on which the runner and the gate are correspondingly located and thus has to be removed or degated from the substrate. Usually, these areas are called "degating region."

In order to manufacture a quality semiconductor package, excellent adhesion of the molding compound to the semiconductor chip and substrate is required. When the excess molding compound in the runner and gate is removed, however, the substrate is subject to delimitation at the time the adhesive force between the molding compound and the substrate exceeds the cohesive strength of the substrate itself. This creates a defective product which is undesirable. In addition, due to excellent adhesion between the molding compound and the substrate, the substrate is easily deformed while removing the excess molding compound in the runner and gate from the substrate. The semiconductor package thus-obtained will then become defective if the substrate is deformed.

In order to resolve the above-mentioned problem, U.S. Pat. No. 5,542,171 discloses a method of making a semiconductor package, which comprises the following steps as shown in FIG. 8:

101 attaching a semiconductor chip to a substrate;

102 electrically connecting the semiconductor chip to the substrate by means of wire bonding;

103 using plasma, etching or sputter etching to clean the impurities on the surfaces of the semiconductor chip and the chip-attached substrate;

104 selectively contaminating the degating region preset on the substrate in order to reduce adhesion between the contaminated areas of the substrate and an molding compound subsequently enclosing the substrate;

105 encapsulating the semiconductor chip and the substrate by molding a molten molding compound over the semiconductor chip and the substrate; and

106 degating the remainder of the molding compound formed on said contaminated areas of the substrate.

More specifically, in accordance with the disclosure of the U.S. Pat. No. 5,542,171, a semiconductor chip is attached onto and then electrically bonded to a substrate; the surface of the substrate to which the semiconductor chip is attached is subsequently cleaned by plasma in order to remove impurities thereon, so that the molding compound can have greater adhesion to the semiconductor chip and substrate after the molding compound is hardened. Subsequent to the completion of the cleaning, a polymer coating or a layer of permanent ink is contaminatively applied on the preset degating region of the substrate (i.e., those area where runners and gates are located); after the substrate has been selectively contaminated, transfer molding is performed to encapsulate the semiconductor chip and substrate. Because the surface of the substrate has been selectively contaminated with a polymer coating or a layer of permanent ink on the degating region of the substrate, the adhesion of the molding compound to the contamination layer is significantly less than the adhesion of the molding compound formed into the encapsulant to the substrate. Therefore, the molding compound in the runner and gate can be easily degated and cleanly peeled away from the contamination layer on the substrate without resulting in damage to or deformation of the substrate. However, there still exits drawbacks in the prior art process.

The contamination is performed after the semiconductor chip is mounted on and electrically connected to the substrate by wire bonding. Therefore, the contamination treatment would also contaminate the semiconductor chip and/or gold wires on the substrate, resulting in a defective product. In other words, the contamination treatment has to be carefully and accurately carried out in order to prevent the semiconductor chip and gold wires from being contaminated, so that the contamination will increase the manufacturing cost and be time-consuming. In addition, although the contamination favors the removal of the molding compound in the runner and gate from the substrate, the contaminative layer still adheres to the substrate and has to be removed after the molding compound in the runner and gate breaks away from the substrate. It is more difficult to remove the contaminative coating from the substrate because of its secure adhesion to the surface of the degating region of the substrate. Accordingly, the removal of the contaminative coating will increase the manufacturing cost and complicate the packaging process. Furthermore, since the quality requirement for semiconductor packages is increasing, the adhesive force between the molding compound and the substrate as well as that between the semiconductor chip and the substrate have to be increased so as to prevent incomplete adhesion from taking place. Therefore, molding compound of high viscosity is usually used as the encapsulating material making the adhesion between the molding compound and the contaminative coating accordingly enhanced. It may, as a result, cause the adhesive force between the contaminative coating and the surface of the substrate to be unable to exceed the adhesive force between the contaminative coating and the molding compound, thus making the molding compound solidified and formed on the contaminative coating failed to be completely removed. Consequently, damage to or distortion of the substrate may occur.

In view of the drawbacks posed by U.S. Pat. No. 5,542,171, Amkor U.S. Pat. No. 5,635,671 proposes another method of making a semiconductor package. The method features in that a metallic layer (gold or palladium) is pre-plated on the degating region of the substrate before the transfer molding, so that the adhesive force between the molding compound and the metallic layer is less than the adhesive force between the molding compound and the substrate. This makes it easier to degate the molding compound from the surface of the metallic layer without damaging the substrate or the encapsulant. However, this method still poses drawbacks which call for improvement.

Expensive metals such as gold or palladium are used as the metallic layer which will increase the manufacturing cost. Further, since molding compound of high viscosity has to be used as the encapsulating material for molding, the problem of incomplete removal of the molding compound from the metallic layer as set forth above still exists because of the strength of the adhesion between the molding compound and the surface of metallic layer, thus easily making damage to the substrate and the encapsulant itself. In addition, as shown in FIG. 7, a metallic layer 614 is plated on a substrate according to this prior art; the material of the metallic layer 614 is different form that of the substrate, and thermal stress varies greatly from the beginning to the end of the transfer molding i.e., from about 175° C. to ambient temperature, distortion of the substrate will unavoidably take place.

SUMMARY OF THE INVENTION

It is an objective of the present invention that provides a method of making a semiconductor package which can easily remove the molding compound in the runner and gate from the substrate without damaging the substrate.

Another objective of the present invention is to provide a method of making a semiconductor chip, which can remove from the substrate a coating layer applied onto the degating region of the substrate together with the molding compound molded over the layer of coating.

Still another objective of the present invention is to provide a method of making a semiconductor package of which a conventional two-piece mold can be used to perform transfer molding.

A further objective of the present invention is to provide a method of making a semiconductor package of which the coating layer can be in advance applied to the degating region of the substrate, so that the packaging process is the same as the conventional ones.

Still another objective of the present invention is to provide a method of making a semiconductor package of which the coating layer is applied onto the substrate prior to the die bonding and wire bonding, whereby preventing the semiconductor chip attached on the substrate and the bonding wires from contamination.

To achieve these and other objectives of the present invention, the method of making a semiconductor package of this invention comprises applying a coating layer to a degating region of a substrate on which a runner and a gate of an encapsulating mold are located, allowing the adhesion between the coating layer and the surface of the substrate to be less than that between the coating layer and a molding compound subsequently molded over the coating layer. A semiconductor chip is then attached to the substrate followed by a cleaning treatment to the surfaces of the substrate and semiconductor chip. The semiconductor chip is then electrically connected to the substrate by wire bonding. After that, the molding compound is transfer molded to enclose the semiconductor chip and part of the surface of the substrate. The molding compound solidified and formed in the runner and gate of the encapsulating mold is then removed from the substrate by breaking away, together with the coating layer adhered thereto.

Suitable coating materials for the coating layer are high molecular polymers such as epoxy resins. The high molecular polymers used as the coating material is incompletely polymerized when in curing the molding compound, allowing the coating material to incompletely adhere to the surface of the substrate. Thus, the adhesion between the coating layer and conventional molding compound such as epoxy resins, polyurethanes, silicone resins, polyamides or polyimides, etc. exceeds the adhesion between the coating layer and the surface of the substrate. Consequently, the coating layer is removed with the molding compound molded over the coating layer by breaking away the molding compound from the substrate, permitting no coating layer to remain on the degating region of the substrate. As no coating layer remains on the substrate, there is no need to clean the substrate subsequent to the breaking-away of the molding compound molded over the coating layer. In addition, since the process of cleaning the semiconductor chip and the chip-attached substrate is performed after the application of the coating layer to the degating region of the substrate, there is no impurity on the surface of the coating layer, allowing the adhesive force between the molding compound and the surface of the coating layer strengthened.

The application of the coating layer can be carried out by means of screen printing or pad printing. Since there is a requirement of 0.03 mm of precision of the coating position on the substrate, the utilization of screen printing or pad printing permits the coating layer to be applied precisely at the desired position of the substrate; therefore, the die bonding and the wire bonding can be carried out without adverse affection by the coating layer. In addition, since the coating layer is applied to the substrate prior to the die bonding and wire bonding, the coating application poses no contamination problem to the semiconductor chip and bonding wires and incurs no additional procedure to the packaging process.

BRIEF DESCRIPTION OF THE DRAWINGS

FIG. 6 is a block diagram illustrating the steps of the method of making a semiconductor package according to this invention;

DETAILED DESCRIPTION OF THE INVENTION

Figure 1:
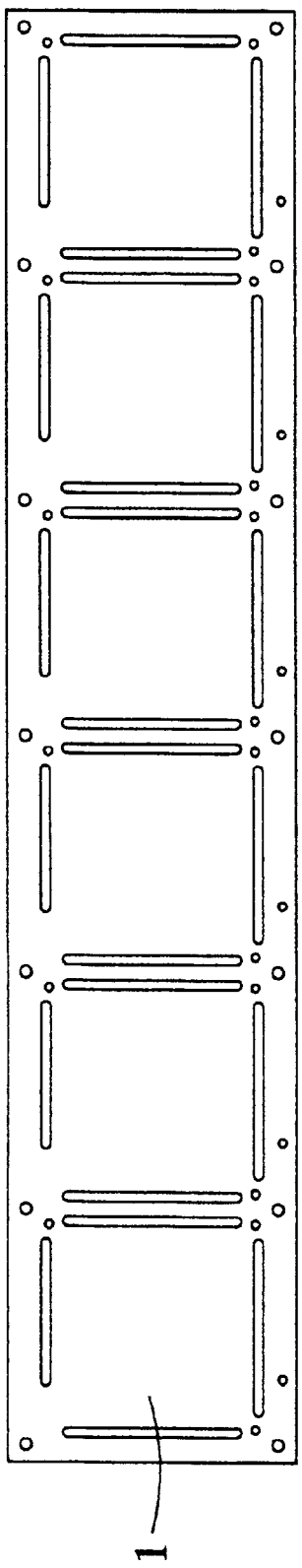
FIG. 1 is a plane view of a substrate strip having six units of substrates used in the method of encapsulating a chip according to this invention.

Referring to FIG. 1, a substrate 1 used in the preferred embodiment of this invention has six substrate units formed in a strip in favor of mass production of making semiconductor packages. The chip carrier may be manufactured in single or in an array format which is compreencible to those skilled in the art.

Now referring to FIG. 6, it shows a flow chart of the process steps of the method of the preferred embodiment for making a semiconductor chip.

At process step 601, a coating layer 2 is applied by screen printing or pad printing to a selected area on the substrate 1. The selected area is a region of the substrate 1 on which a runner and a gate of an encapsulating mold are located, which is usually called "degating region".

Figure 2:
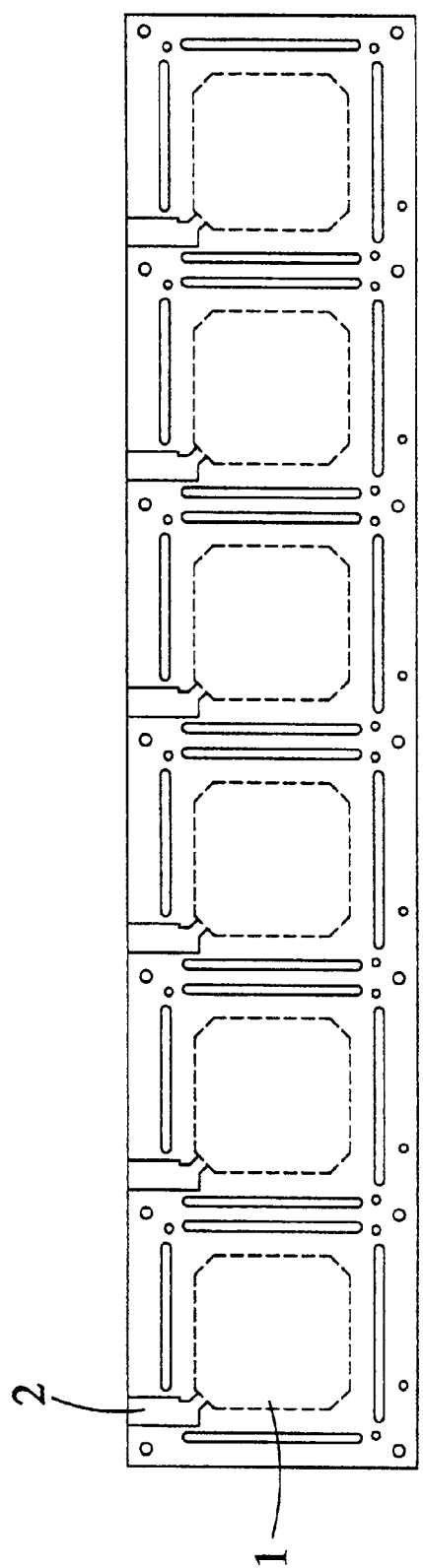
FIG. 2 is a plane view of the substrate strip of FIG. 1 having a coating layer applied on the degating region of each substrate unit where runners and gates in the encapsulating mold are to be located.
Figure 3:
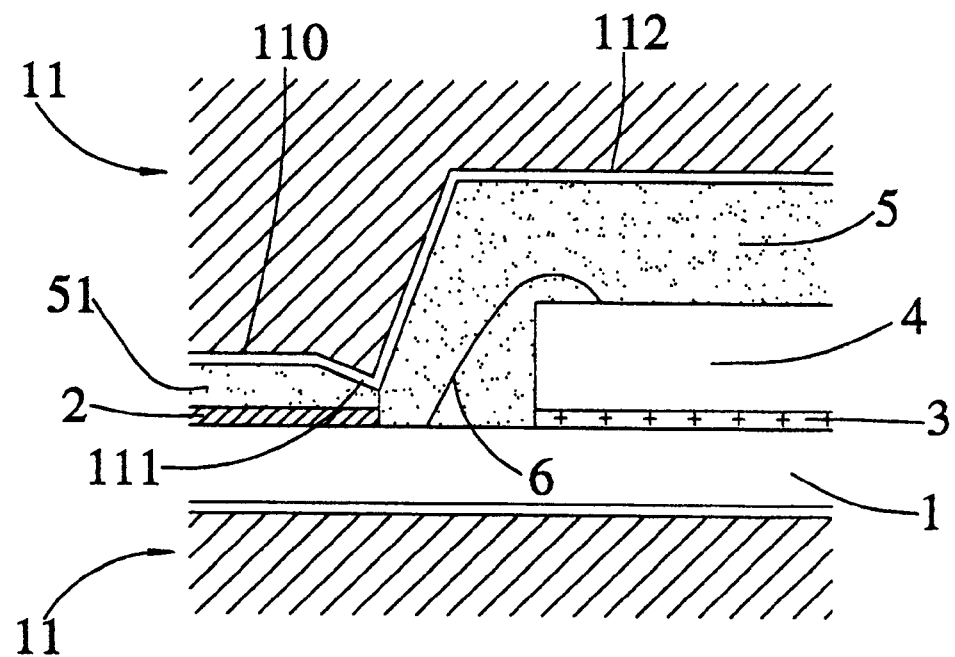
FIG. 3 is a partial cross sectional view of a semiconductor package manufactured by the method in accordance with this invention, when placed in the mold cavities of the encapsulating mold.

The range of the coating layer 2 extends inwardly from an edge of the substrate 1 to the edge of a square area enclosed by the dashed line shown in FIG. 2. The square area enclosed by the dashed line is the position where a semiconductor chip 4 (as shown in FIG. 3) is subsequently attached.

Suitable coating materials for the coating layer 2 are high molecular polymers selected from the group consisting of expoxy resins and polyimides. The coating materials used for the coating layer are required to incomplete polymerize during the curing of mold compound subsequently molded over the substrate 1, so as to allow the adhesion between the coating layer 2 and the surface of the substrate 1 to be less than the adhesion between the coating layer 2 and the molding compound subsequently molded over the coating layer 2.

At process step 602, a semiconductor chip 4 is attached to the square area on the substrate 1 by use of a die attach adhesive such as a silver-filled epoxy adhesive 3. The epoxy adhesive 3 is then cured at a high temperature for stabilization.

At process step 603, the surfaces of the substrate 1 and semiconductor chip 4 are cleaned by conventional plasma cleaning in order to keep the surfaces of the substrate 1 and semiconductor chip 4 from impurities. After the cleaning treatment is completed, the surfaces of the substrate 1 and semiconductor chip 4 are in a condition well enough to have an excellent adhesion with the molding compound subsequently molded thereover. Therefore, the incomplete adhesion or delamination between the molding compound and the substrate 1 and semiconductor chip 4 can be avoided and the quality of the semiconductor packages thus-obtained can thus be assured.

At process step 604, the semiconductor chip 4 are wire bonded to the substrate 1 by gold wires 6, so as to establish an electrical connection therebetween. The electrical connection between the substrate 1 and the semiconductor chip 4 may be achieved by conventional tape automated bonding (TAB) techniques or flip-chip techniques. Because the coating layer 2 is applied to the substrate 1 prior to the die bonding (process step 602) and wire bonding (process step 604), the die bonding and wire bonding can be performed by conventional packaging equipments and processes and the gold wires 6 and semiconductor chip 4 are free from contamination which may be caused by the coating layer 2.

Figure 4:
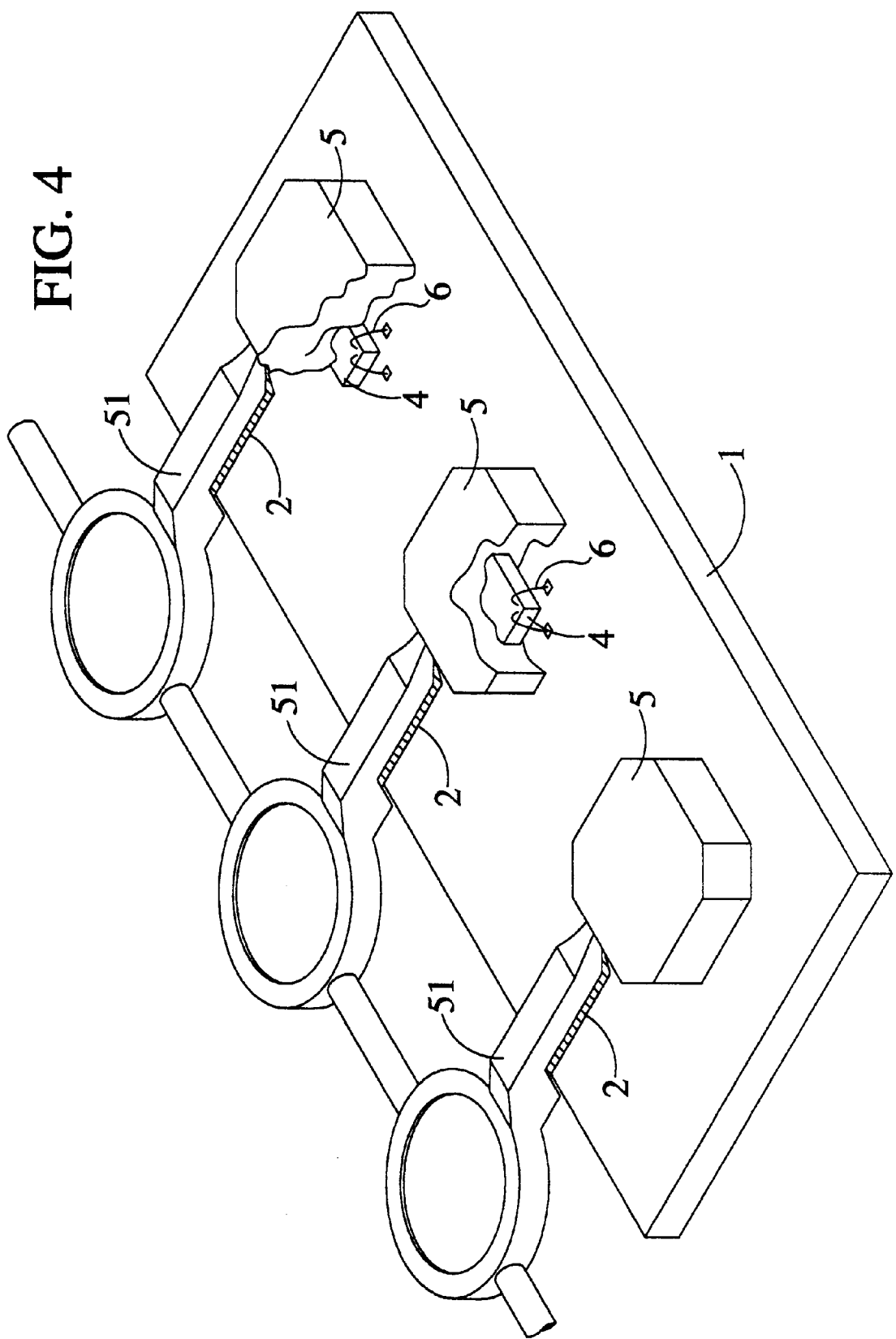
FIG. 4 is a cutaway perspective view of FIG. 3 after de-molding, which shows the molding compound solidified in runners and gates of the encapsulating mold is still connected to the encapsulant formed by the molding compound.
Figure 7:
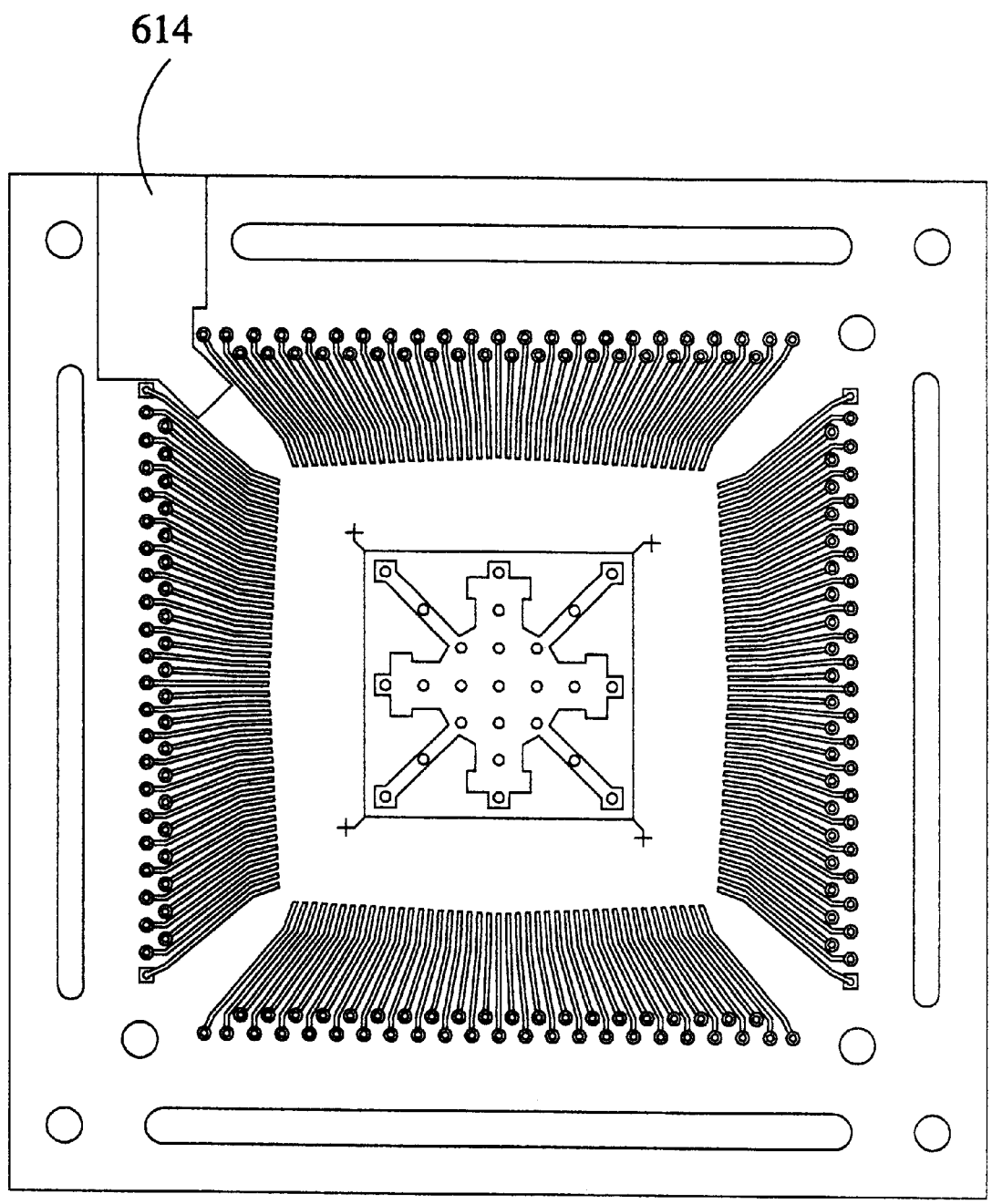
FIG. 7 is a plane view of a substrate of U.S. Pat. No. 5,635,671, which shows a metallic layer is coated on the degating region of the substrate.
Figure 8:
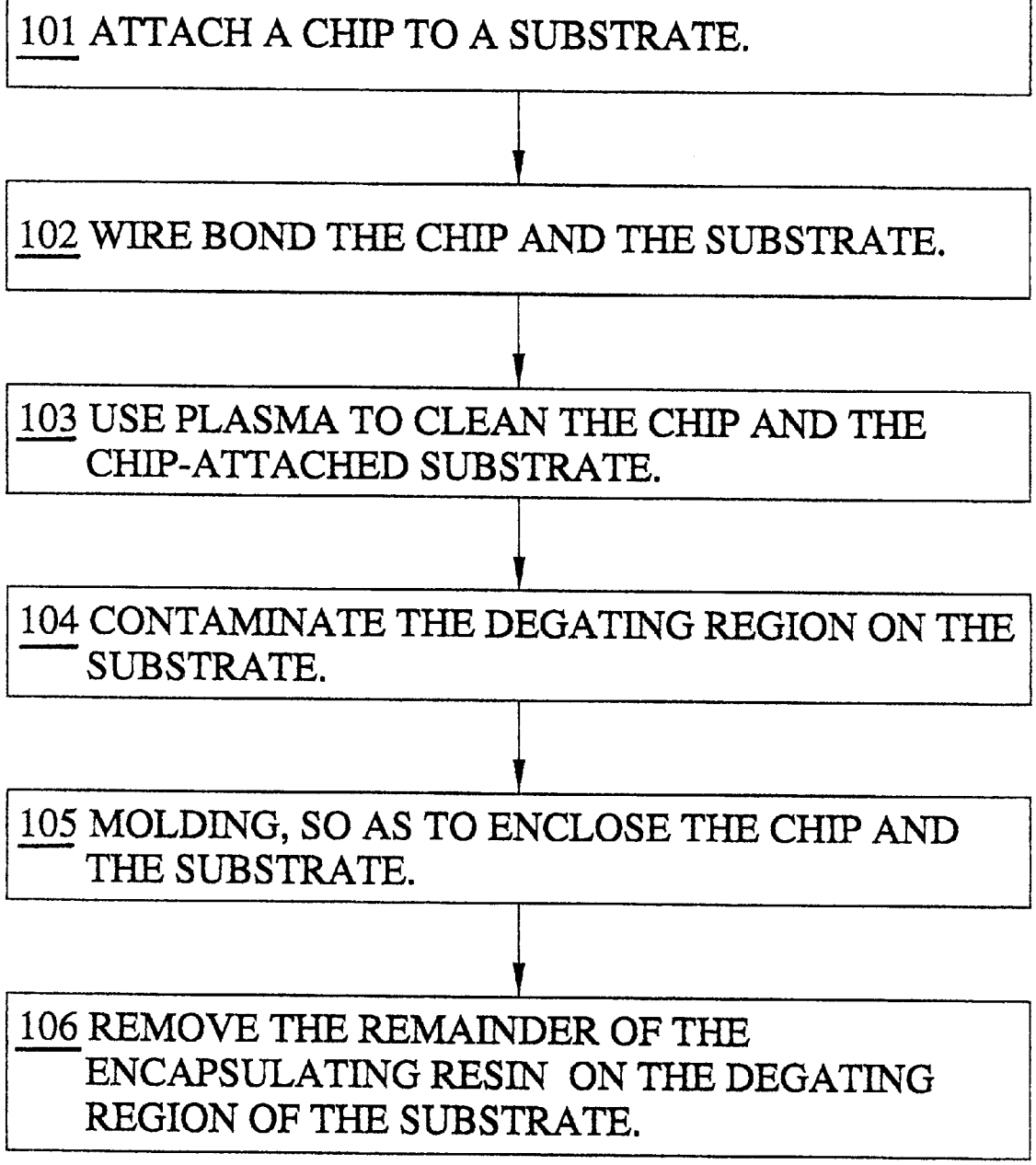
FIG. 8 is a block diagram illustrating the encapsulating process according to U.S. Pat. No. 5,542,171.

At process step 605, the substrate 1 with the semiconductor chip 4 attached thereto is disposed in a mold cavity 112 of a conventional two-piece mold 11. As shown in FIG. 3, the mold 11 is provided with a tree-like array of runners 110 with one end connecting to a central reservoir (not shown) for storing molten molding compound and another end connecting to a gate 111 for molten molding compound to pass therethrough to flow into the mold cavity 112. After the mold 11 is closed, the molten molding compound is mold injected from the runners 110 to the mold cavity 112 via the gates 111 until the mold cavity 112 is full. When the molding compound solidifies, referring to FIG. 4, an encapsulant 5 enclosing the semiconductor chip 4 and part of the surface of the substrate 1 is formed. And the molding compound solidified in the runner 110 and gate 111 is also formed as a redundant portion 51. The bottom surface of the redundant portion 51 is adhered to the coating layer 2. In addition, the molding compound may be any type of plastic material, such as epoxys, polyimides, urethanes, etc.

Figure 5:
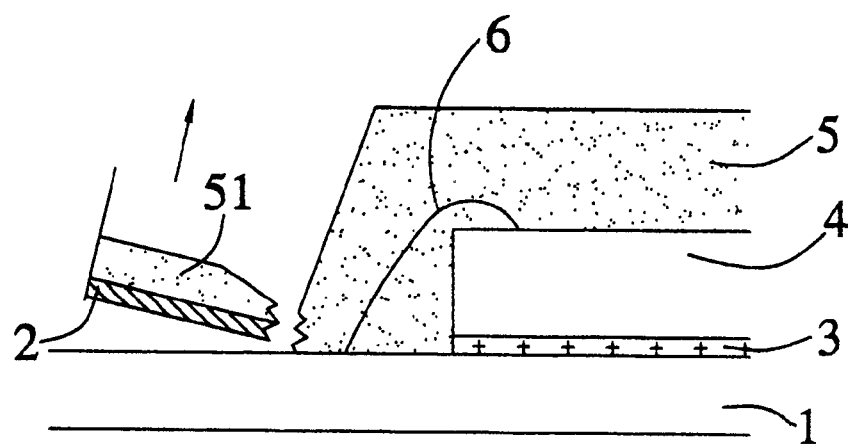
FIG. 5 shows the motion wherein the encapsulant on areas of the substrate corresponds to where runners and gates in the encapsulating mold are located is being degated.

At process step 606, the redundant portion 51 is removed from the substrate 1 by breaking away, as shown in FIG. 5. As the coating layer 2 is incompletely polymerized while the molding compound is cured at a high temperature, the coating layer 2 is accordingly incompletely adhered to the surface of the substrate. Therefore, the adhesion between the molding compound and the coating layer 2 exceeds the adhesion between the coating layer 2 and the substrate 1. As a result, the coating layer 2 is also removed from the substrate 1 at the time of the removal of the redundant portion 51, leaving no coating layer 2 on the substrate 1 after the redundant portion 51 breaks away from the encapsulant 5.

EXAMPLE

Twelve pieces of CCL-H832 bismaleimide triazine resin substrate produced by Mitsubishi Gas Company were used as the substrate. After coating a layer of No. 7224 ink mixed with No. 9060 ink produced by Markem Company by means of screen printing on the designated region of each substrate on which the runner and gate of an encapsulating mold are located, and curing the ink at 150° C. for 5 minutes, semiconductor chips were attached to each substrate respectively. Wire bonding was then carried out so as to electrically connect the chips to the substrates. Thereafter, cleaning by plasma was performed in order to clean out the impurities on the surfaces of the chips and substrates. After cleaning, transfer molding was performed, using the encapsulating resin PLASKON SMT-B, produced by Rohm and Haas Company, to enclose the chips and the substrates. Finally, the redundant portions formed by the molding compound solidified in the runners and gates of the substrates were degated. The 12 semiconductor packages thus-obtained were then tested to see if there is any defective products; the result was no defective products were found.

It should be noted that the above-mentioned embodiment is intended to illustrate the features and the effects of the present invention, and not to limit the practical forms of this invention. Thus, it will be apparent that any variation or modification made without departing from the spirit and scope disclosed in the specification of the present invention will be encompassed in the claims disclosed below.

What is claimed is:

1. A method of making a semiconductor package, comprising:

applying a coating layer to a degating region of a substrate on which a runner and a gate of an encapsulating mold are located, so that the adhesive force between the coating layer and surface of the substrate is less than the adhesive force between the coating layer and a molding compound subsequently molded over the coating layer;

attaching a semiconductor chip to the substrate;

cleaning out impurities on the substrate and the semiconductor chip attached thereon;

electrically connecting the semiconductor chip and the substrate;

mold injecting a molding compound onto and to enclose the substrate and the semiconductor chip attached thereon; and degating the molding compound solidified and formed in the runner and gate from the substrate together with the coating layer.

2. The method of claim 1, wherein coating materials suitable for the coating layer are high molecular polymers.

3. The method of claim 2, wherein the high molecular polymers are epoxy resins.

4. The method of claim 2, wherein the high molecular polymers are polyimides.

5. The method of claim 1, wherein the coating layer is incompletely polymerized when in curing the molding compound, so that the coating layer is incompletely adhered to surface of the substrate.

6. The method of claim 1, wherein the application of the coating layer is carried out by means of screen printing.

7. The method of claim 1, wherein the application of the coating layer is carried out by means of pad printing.

8. The method of claim 1, wherein the encapsulating mold is a two-piece mold, each having a mold cavity for the molding compound to flow thereinto.

* * * * *